United States Patent [19]

Hodgson et al.

[11] 4,202,704

[45] May 13, 1980

[54] OPTICAL ENERGY CONVERSION

[75] Inventors: Rodney T. Hodgson, Ossining; Harold J. Hovel, Katonah; Jerry M. Woodall, Bedford Hills, all of N.Y.

[73] Assignee: International Business Machines Corporation, Armonk, N.Y.

[21] Appl. No.: 968,887

[22] Filed: Dec. 13, 1978

[51] Int. Cl.$^2$ .................................... H01L 31/04
[52] U.S. Cl. ......................... 136/89 CL; 250/216
[58] Field of Search .............. 136/89 CL, 89 FC; 250/216, 578, 226

[56] References Cited

U.S. PATENT DOCUMENTS

| | | | |
|---|---|---|---|
| 2,919,363 | 12/1959 | Crosby et al. | 313/92 |
| 3,591,420 | 7/1971 | Streed | 136/89 |
| 3,681,102 | 8/1972 | Beall | 106/39 DV |
| 4,096,387 | 6/1978 | Buckley | 250/372 |
| 4,110,123 | 8/1978 | Goetzberger et al. | 136/89 HY |

OTHER PUBLICATIONS

R. T. Hodgson et al., "High Efficiency Ga$_{1-x}$Al$_x$ As—GaAs Solar Cell", *IBM Tech. Disc. Bull.*, vol. 21, pp. 853-854 (1978).

*Primary Examiner*—Aaron Weisstuch
*Attorney, Agent, or Firm*—Alvin J. Riddles

[57] ABSTRACT

Enhanced efficiency can be achieved in the construction of semiconductor optical energy conversion devices such as solar cells by providing a translucent frequency shifting supporting member with appropriate doping such as Al$_2$O$_3$:Cr$^{+3}$ (Ruby) that is capable of shifting the wavelength of incident light energy in the direction of greatest efficiency of the semiconductor device. The efficiency can be further enhanced by providing a crystal perfection accommodation region between the active region of the device and the light frequency shifting substrate.

10 Claims, 3 Drawing Figures

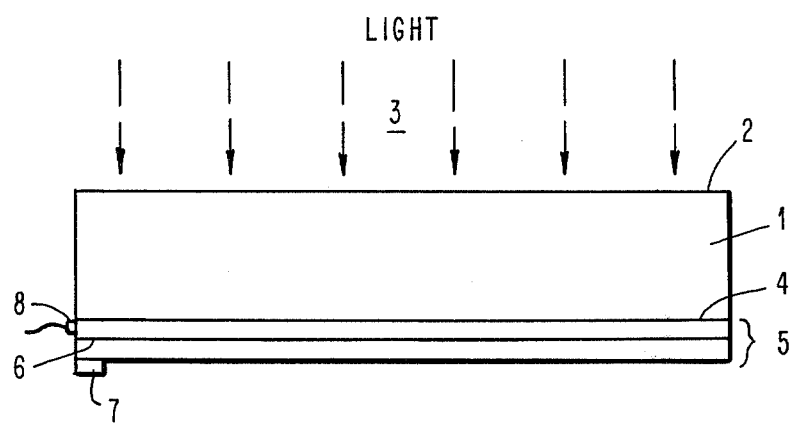
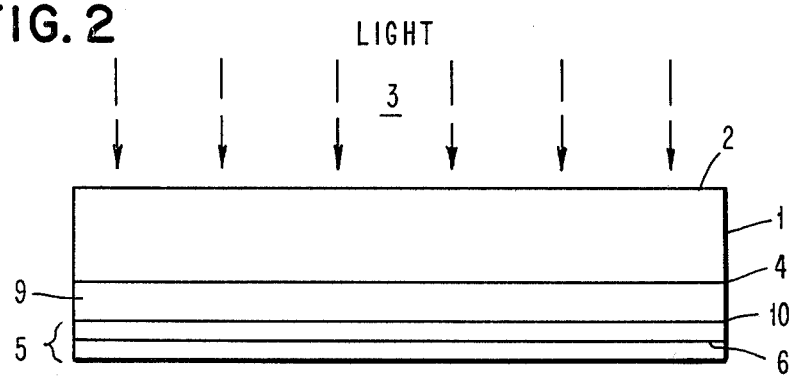
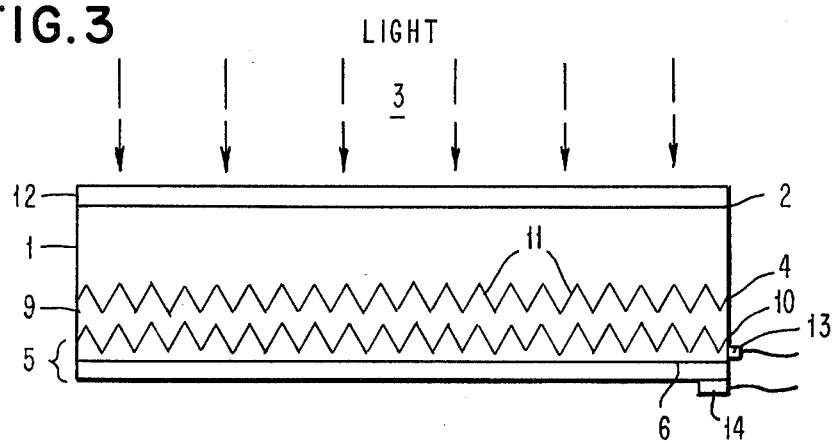

OPTICAL ENERGY CONVERSION

DESCRIPTION

Technical Field

The technical field of the invention is that of optical energy conversion wherein light energy is converted to electrical energy. In this field, light with a very broad spectrum such as the light from the sun, is converted to electrical energy through the generation of and through the electrical responsiveness to, hole-electron pairs in a semiconductor structure. The majority of such semiconductor structures have a response to light frequencies that is much narrower than the range of solar light frequencies. The result of this is that the semiconductor device cannot efficiently use a broad spectrum of light.

Background Art

There have been a number of structures in the development of the field in which the p-n junction of the semiconductor device is supported by a substrate and is equipped with a cover which in addition to serving protective purposes also has included therein some properties for converting the energy of a broad spectrum of light in some frequencies not particularly efficient for the semiconductor device to a frequency range that is more efficient for the semiconductor device. These structures are usually a coating or cover over the solar cell made up of a binder containing a fluorescent energy wavelength shifting material.

BRIEF DESCRIPTION OF THE DRAWINGS

FIG. 1 is an optical conversion device having a frequency converting region.

FIG. 2 is an optical converting device illustrating an atomic spacing accommodation region separating frequency converting support region from the active region thereof.

FIG. 3 is an optical converting device illustrating at the interface of the active region the provision of anti-reflecting properties.

DISCLOSURE OF INVENTION

The invention involves the provision of a translucent frequency shifting support region positioned so the light passes therethrough on the way to the active region of the device so that the frequency of some portion of the spectrum of incident light that is outside the optimum range of the active region response is shifted in the direction of the proper frequency.

The semiconductor active region is usually quite thin in photovoltaic devices and support is required. A material, which shifts frequency, will serve well as such a translucent support.

A particularly satisfactory support material is $Al_2O_3$ doped with trivalent chromium (Ruby).

It is also advantageous to introduce a crystal perfection accommodation region between the support and the active region to enhance active region efficiency. This primarily reduces strains in the semiconductor active region which is preferably grown contiguous with the frequency shifting region. Anti-reflecting properties may be provided by incorporating serrations in the light path between the frequency shifting and active regions.

Such an arrangement can be accomplished by having a ruby frequency shifting region with a serrated surface, an AlAs or $Ga_{1-x}Al_xAs$ crystal perfection accommodation region grown on the serrated surface and a gallium arsenide active semiconductor region grown on the $Ga_{1-x}Al_xAs$ surface.

BEST MODE FOR CARRYING OUT INVENTION

Referring to FIG. 1. The optical energy conversion device of the invention is illustrated having a translucent support member 1 which also operates as an energy or frequency shifting region. The region 1 has a first surface 2 through which incident light 3 enters and a second surface 4 adjacent to which an active region 5 is positioned. The region 5 is capable of converting the optical energy to electrical energy and this capability is illustrated as a p-n junction 6. The electrical signal appears across electrodes 7 and 8. The region 1 serves both as a support for the active region 5 and also serves as a frequency shifting function to take part of the broad spectrum of light 3 and convert it to light of different frequency in accordance with the responsiveness of the particular semiconductor material and p-n junction 6.

For clarity, the invention will be described in connection with a particular support material and particular semiconductor materials but it will be apparent in the light of the principles set forth that other support materials, semiconductor materials and doping may be employed. Further, the semiconductor can be amorphous, polycrystalline or single crystal and the junction, a p-n junction, a heterojunction or Schottky Barrier.

In accordance with the invention it has been found that aluminum oxide, ($Al_2O_3$) when doped with trivalent chromium ($Cr^{+3}$) to form the material well known in the art as Ruby, operates to have a fluorescence take place when irradiated with light at the higher frequency end of the spectrum and thereby convert those higher frequencies of the light to lower frequencies that are more useful and compatible with the responsiveness of the active region of the device. Other materials and other dopants can produce other frequency shifts appropriate to the type of incident light and responsiveness of the device.

As a particular example, when the active region 5 is of GaAs containing a p-n junction 6, the portion of the light 3 that has frequencies with corresponding wavelengths in air of less than 6,000 Å can be efficiently absorbed by trivalent chromium ions in a concentration range of 0.2% to 2% with 0.7% preferred, which have been introduced into the $Al_2O_3$ lattice of the region 1 as a dopant. This absorption operates to shift 3800 to 4500 Å wavelength and 5,000 to 6,000 Å wavelength light into a wavelength of 6,943 Å in the quantity of approximately 50% and into 7,000 to 8,000 Å wavelength light in the remaining quantity of approximately 50%. These wavelengths then, where the junction 6 in the region 5 is positioned in the vicinity of 1 micron from the interface 4, will penetrate far enough so that surface recombination of the electron-hole pairs generated there is greatly reduced. It is well known that surface recombination losses limit the efficiency of conventional GaAs p-n junction solar cells.

Referring next to FIG. 2, an improved version of the structure of FIG. 1 is provided. The standard practice in fabrication of devices of this type is to physically grow the semiconductor active region on a substrate. In the structure of this invention where the substrate is the member through which the light passes, the active region is grown on the substrate with the p-n junction very close to the interface. Frequently, however, there is some measure of atomic spacing incompatibility between the crystalline lattice of two regions. To accommodate this, in this invention, a crystal perfection accommodation layer 9 of FIG. 2 is interposed.

In FIG. 2 the incident light 3 falls on the frequency shifting region 1 through the surface 2 where some portion of the light is converted to a frequency that is compatible with the response of the active region 5. The region 9 has an atomic spacing between that of $Al_2O_3$ and that of the active region, preferably closely matched to the active region, is epitaxial with the surface 4 of the frequency shifting region and is also epitaxial with the surface 10 of the active region 5.

In growing gallium arsenide or other semiconductors for the active region 5 on an $Al_2O_3$:$Cr^{3+}$ light transmitting support 1, the first several microns of material of region 5 that would be grown on the region 1 interface 4 contains a large number of defects and this in turn will reduce the efficiency of a solar cell. While this can be partially overcome by growing the region 5 to a thickness of about 10 microns or more and moving the junction 6 farther away, such movement may effect efficiency.

In accordance with the invention, a defect reducing buffer layer or crystal perfection accommodation region 9 can be epitaxially grown on the interface 4 out of material with an intermediate atomic spacing or with an atomic spacing or lattice constant close to that of the material in the active region 5 with minimal light attenuation properties. The region 9 should be transparent to light transmitted through region 1 which has frequencies in the range of sensitivity in the active region 5 and to the fluorescence light from region 1. The active region 5 can then in turn be grown on the interface 10 with the region 9. The crystal perfection accommodation region 9 may preferably be a 5–10 micron thick layer.

In accordance with the invention having the structure of FIG. 2, where the $Al_2O_3$ region 1 is doped with trivalent chromium, Ruby, the layer 9 may be AlAs or $Ga_{1-x}Al_xAs$ where $x \geq 40\%$. Over this, the active region 5, a 1–2 micron thick active layer of gallium arsenide may be grown.

The light 3 passing through the $Al_2O_3$:$Cr^{+3}$ frequency conversion region has the high frequency portion thereof that would ordinarily be absorbed with little photovoltaic effect, now shifted by the Ruby to lower frequencies. Since the crystal perfection accommodation region 9 is transparent to fluorescence frequencies and to the light of lower frequencies than those absorbed in the Ruby, the light then passes through region 9 and into the active region 5. The crystal perfection region 9 of $Ga_{1-x}Al_xAs$ forms a low surface recombination velocity interface with the GaAs active region 5. The atomic growth defects are mostly located in the $Ga_{1-x}Al_xAs$ region 9 which permits the active GaAs region 5 to be of much better quality than would be if grown directly on the aluminum oxide.

In growing a layer such as $Ga_{1-x}Al_xAs$, a cost advantage is acquired by making the x value in the formula, $Ga_{1-x}Al_xAs$ high which, in essence, is to use as little gallium as possible.

Where the region 9 is AlAs or $Ga_{1-x}Al_xAs$, a lower index of refraction is achieved as compared with the region 5 when made of GaAs and hence, the optical loss that would otherwise occur in the $Al_2O_3$-GaAs interface, is reduced.

Referring next to FIG. 3, in accordance with the invention, anti-reflecting properties may also be introduced into the device by providing the surface of the region 1 on which the atomic spacing accommodation region 9 is to be grown, with a series of serrations or trenches 11 in the surface 4 so that the incident light will be trapped in multiple reflections. In FIG. 3 the $Al_2O_3$ frequency shifting region 1 also has on the surface 2 thereof an anti-reflecting coating 12 which may be a single layer of a material such as magnesium fluoride with a thickness of approximately 1,000 Å. The incident light 3 passes through the coating 12 and the surface 2 and a portion of the spectrum is frequency converted in the frequency shifting region 1 to the wavelength compatible with the active region 5. The light produces an electrical signal between electrodes 13 and 14. The region 1 is provided with the serrations either mechanically ion milling, or anisotropic chemical etching. The region 9 is then grown on the serrations 11 from the surface 4 to the surface 10 and the active region 5 is formed thereon. The resulting structure is a highly efficient optical conversion device.

The high frequency light which is usually ineffective in producing electricity is converted to lower frequency with quantum efficiency of approximately 90%. Only 6% of the fluorescent light escapes from surface 2 of region 1 since most fluorescent light is incident on surface 2 at greater than the critical angle for internal reflection and is reflected to surface 4 between region 1 and region 9. Since the index of refraction of region 9 is greater than the index of refraction of region 1, there is no critical angle and a large part of the fluorescent light is transmitted to region 5.

As a result of the efficiency of such light to light photon conversion due to the index of refraction considerations, light may be absorbed in region 1 in the spectral region where the active region 5 is sensitive with little loss in output power.

Due to the high fluorescent quantum efficiency of the $Cr^{+3}$ and the photon trapping effect resulting from the large index of refraction of the $Al_2O_3$ there is only a small loss of efficiency of converting photons incident on surface 2 to photons absorbed by region 5. Therefore, there is no need to prevent absorbtion by region 1 which would normally be efficiently covered by region 5 without the presence of region 1.

What has been described is an optical conversion device wherein a photo-voltaic active semiconductor region with limited spectral sensitivity is atomically interacted with a frequency converting substrate through which the light passes so that an interdependent semiconductor conversion device with optically favorable characteristics is produced.

Having described the invention, what is claimed as new and what is desired to secure by letters patent is:

1. An optical conversion device comprising in combination:
   a translucent frequency shifting support member having an essentially crystalline structure with a first interatomic spacing and further having first and second essentially parallel major surfaces, said first major surface adapted to receive incident radiation;
   a semiconductor photoresponsive active region facing said second major surface of said support member and having a second interatomic spacing; and
   a crystal perfection accommodation region epitaxial with both said second major surface of said support member and said photoresponsive region and having a third interatomic spacing of a size between said first and said second interatomic spacings and being interposed between said support member and said photoresponsive region.

2. The device of claim 1 wherein said support member is Al$_2$O$_3$ doped with trivalent chromium.

3. An optical conversion structure comprising:
translucent member having first and second essentially parallel major surfaces and having the capability of shifting the frequency of at least a portion of light entering said member through said first surface;
a photoresponsive member facing the second of said essentially parallel major surfaces;
a crystal perfection accommodation region interposed between said translucent member and said photoresponsive member and including a serrated interface between said translucent member and said photoresponsive member.

4. The structure of claim 3 wherein said first member is aluminum oxide doped with trivalent chromium.

5. The structure of claim 4 wherein said photoresponsive member is GaAs.

6. The conversion structure of claim 5 wherein said crystal perfection accommodation region is aluminum arsenide.

7. The optical conversion structure of claim 5 wherein said crystal perfection accommodation region is Ga$_{1-x}$Al$_x$As wherein x is equal or greater than 40%.

8. An optical conversion apparatus comprising in combination:
a translucent frequency shifting support member of Al$_2$O$_3$ doped with trivalent Cr having first and second essentially parallel major surfaces, said second surface being serrated and said support member having the capability of shifting the frequency of at least a portion of light entering said member;
a semiconductor photoresponsive active region grown contiguous with said second surface;
a crystal perfection accommodation region grown in interposed position between said second surface and said photoresponsive region,
means irradiating said first surface with light; and
means for conducting electrical signals appearing in said photosensitive region.

9. The apparatus of claim 8 wherein said crystal perfection accommodation region is AlAs.

10. The apparatus of claim 8 wherein said crystal perfection accommodation region is Ga$_{1-x}$Al$_x$As where x is equal or greater than 40%.

* * * * *